US009799680B2

(12) United States Patent
Kao et al.

(10) Patent No.: US 9,799,680 B2
(45) Date of Patent: Oct. 24, 2017

(54) TFT ARRAY SUBSTRATE, DISPLAY PANEL, AND TFT STRUCTURE

(71) Applicant: HON HAI PRECISION INDUSTRY CO., LTD., New Taipei (TW)

(72) Inventors: Yi-Chun Kao, Hsinchu (TW); Hsin-Hua Lin, Hsinchu (TW); Po-Li Shih, Hsinchu (TW); Chih-Lung Lee, Hsinchu (TW)

(73) Assignee: HON HAI PRECISION INDUSTRY CO., LTD., New Taipei (TW)

( * ) Notice: Subject to any disclaimer, the term of this patent is extended or adjusted under 35 U.S.C. 154(b) by 25 days.

(21) Appl. No.: 14/808,594

(22) Filed: Jul. 24, 2015

(65) Prior Publication Data
US 2016/0118411 A1    Apr. 28, 2016

(30) Foreign Application Priority Data
Oct. 27, 2014    (TW) .............................. 103137034 A

(51) Int. Cl.
H01L 27/14    (2006.01)
H01L 29/04    (2006.01)
H01L 29/15    (2006.01)
H01L 31/036   (2006.01)
H01L 27/12    (2006.01)

(52) U.S. Cl.
CPC ........ H01L 27/124 (2013.01); H01L 27/1251 (2013.01)

(58) Field of Classification Search
CPC ............... H01L 27/124; H01L 27/1214; H01L 27/1251; H01L 27/3248
See application file for complete search history.

(56) References Cited

U.S. PATENT DOCUMENTS

| 7,277,145 | B2* | 10/2007 | Luo | G02F 1/133555 349/114 |
| 8,102,481 | B2* | 1/2012 | Chung | G02F 1/136259 349/54 |
| 2003/0141504 | A1 | 7/2003 | Kuwabara | |
| 2004/0004685 | A1* | 1/2004 | Luo | G02F 1/133555 349/113 |
| 2006/0038942 | A1* | 2/2006 | Luo | G02F 1/133555 349/114 |
| 2006/0038943 | A1* | 2/2006 | Luo | G02F 1/133555 349/114 |

(Continued)

FOREIGN PATENT DOCUMENTS

TW    201338102 A    9/2013

Primary Examiner — Thanh Y Tran
(74) Attorney, Agent, or Firm — Steven Reiss

(57) ABSTRACT

A TFT array substrate includes a plurality of scan lines, a plurality of date lines, a plurality of pixels, a first TFT, and a second TFT. The number of scan lines includes a first scan line. The date lines are insulated with the scan lines include a first date line and a second date line. The first date line is insulated and at least partly covering the second date line. The pixels are defined by two adjacent scan lines and two adjacent date lines. The first TFT is configured to drive a first pixel at the first side of the first scan line and being coupled with the first scan line and the first date line. The second TFT is configured to drive a second pixel at the second side of the first scan line and being coupled with the first scan line and the second date line.

14 Claims, 20 Drawing Sheets

(56) References Cited

U.S. PATENT DOCUMENTS

| | | | | |
|---|---|---|---|---|
| 2010/0259699 A1* | 10/2010 | Yen | .................. | G02F 1/136286 |
| | | | | 349/38 |
| 2012/0050657 A1* | 3/2012 | Lin | .................. | G02F 1/136286 |
| | | | | 349/139 |
| 2013/0207169 A1* | 8/2013 | Wu | .................. | H01L 27/14643 |
| | | | | 257/292 |
| 2013/0229397 A1* | 9/2013 | Huang | ................. | G09G 3/3648 |
| | | | | 345/207 |
| 2013/0240886 A1* | 9/2013 | Yeh | .................... | H01L 27/1222 |
| | | | | 257/57 |
| 2015/0228700 A1* | 8/2015 | Cho | .................. | H01L 27/3244 |
| | | | | 257/40 |
| 2016/0005767 A1* | 1/2016 | Shen | ................. | G02F 1/136286 |
| | | | | 257/72 |

* cited by examiner

US 9,799,680 B2

TFT ARRAY SUBSTRATE, DISPLAY PANEL, AND TFT STRUCTURE

CROSS-REFERENCE TO RELATED APPLICATIONS

This application claims priority to Taiwanese Patent Application No. 103137034 filed on Dec. 27, 2014, the contents of which are incorporated by reference herein.

FIELD

The subject matter herein generally relates to a thin film transistor (TFT) array substrate, a display panel using the TFT array substrate, and a TFT structure related thereof.

BACKGROUND

A display panel, such as a liquid crystal display panel or an organic light emitting diode display panel, includes a TFT array substrate. A TFT array substrate includes a plurality of scan lines and a plurality of data lines insulted with and cross the number of scan lines. A TFT is disposed at an intersection point of one of the scan lines and one of the data lines, coupled to the scan line and the data line, and switched by the coupled scan line and the coupled data line. The scan lines and the data lines are made of metal. Thus, an improvement of an opening ratio of the TFT array substrate is needed.

BRIEF DESCRIPTION OF THE DRAWINGS

Implementations of the present technology will now be described, by way of example only, with reference to the attached figures.

DETAILED DESCRIPTION

Figure 1:
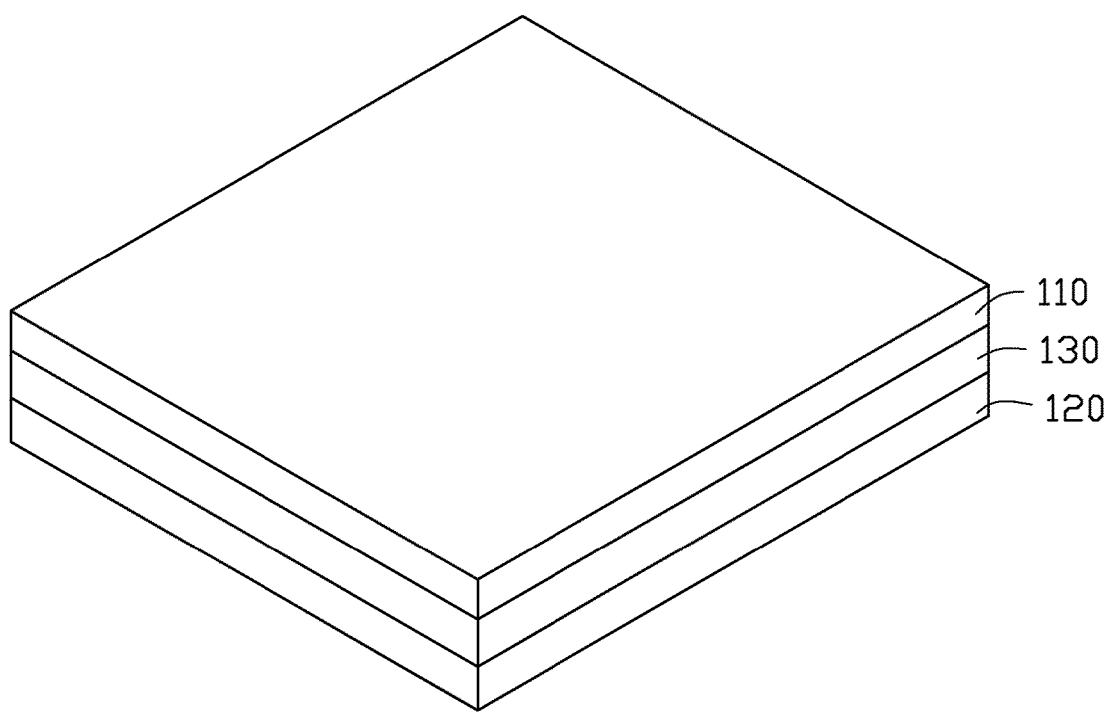
FIG. 1 is an isometric view of display panel.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures and components have not been described in detail so as not to obscure the related relevant feature being described. Also, the description is not to be considered as limiting the scope of the embodiments described herein. The drawings are not necessarily to scale and the proportions of certain parts have been exaggerated to better illustrate details and features of the present disclosure.

FIG. 1 is an isometric view of the display panel 100. In the embodiment, the display panel 100 can be for example a liquid crystal display (LCD) panel. the display panel 100 includes a first substrate 110, a second substrate 120, and a liquid crystal layer 130 sandwiched between the first substrate 110 and the second substrate 120. The first substrate 110 is a TFT array substrate 110. The second substrate 120 is an opposite substrate.

Figure 2:
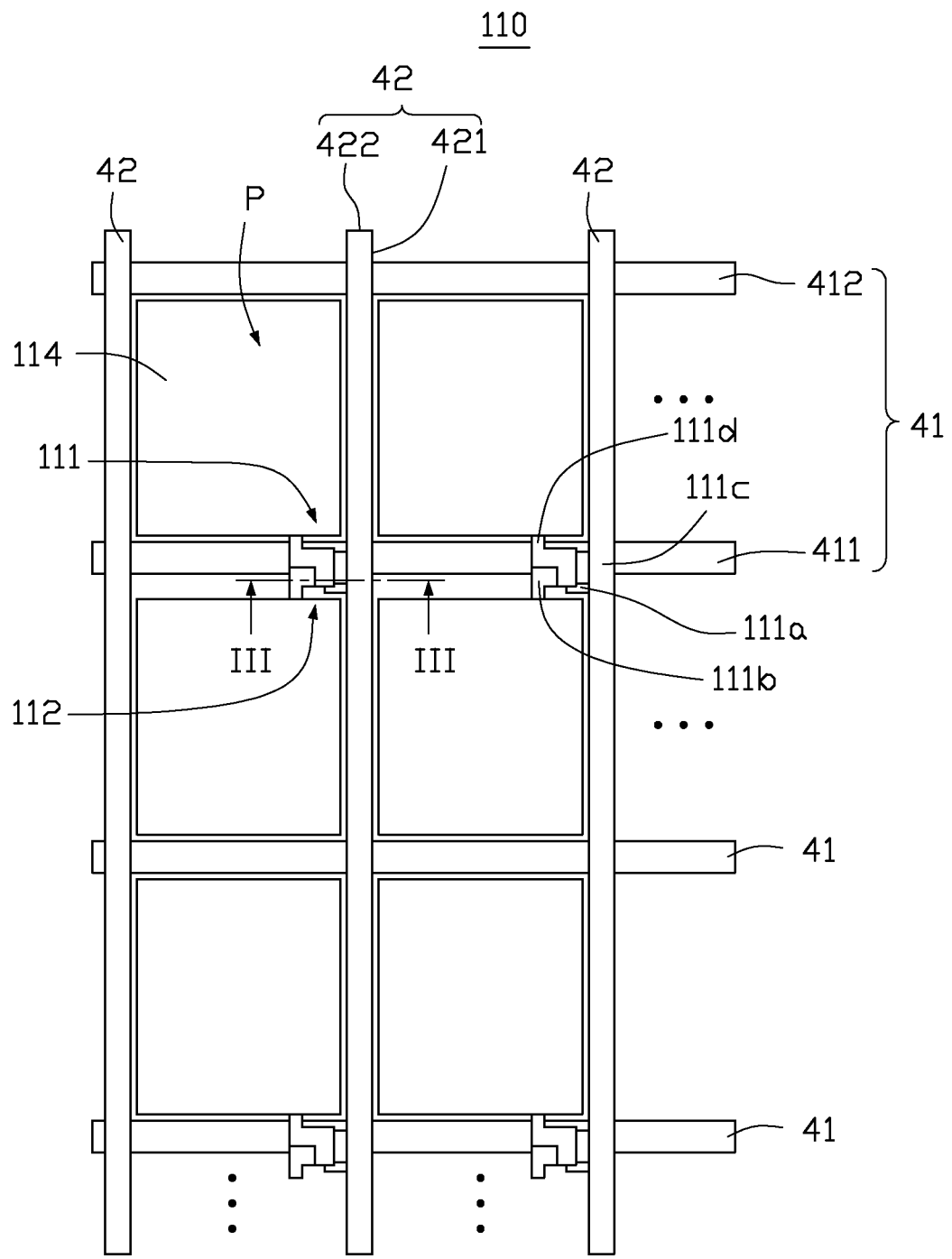
FIG. 2 is a top view of a TFT array substrate of the display panel.

Referring to FIG. 2, the TFT array substrate 110 includes a plurality of scan lines 41 and a plurality of data lines 42. The scan lines 41 and the data lines 42 are insulted with and cross each other. Two adjacent scan lines 41 and two adjacent data lines 42 define a pixel P. Each of the pixels P includes a pixel electrode 114. The number of scan lines 41 includes a first scan line 411 and a second scan line 412 adjacent to and insulated with the first scan line 411. The first scan line 411 and the second scan line 412 define a row of pixels. The number of data lines 42 includes a first data line 421 and a second data line 422. The second data line 422 is insulated with the first data line 421 and at least partly overlaps with the first data line 421.

The TFT array substrate 110 further includes a first TFT 111 and a second TFT 112 which are configured to switch on or off the two adjacent pixels P at two sides of a same scan line 41. In the embodiment, the first TFT 111 and the second TFT 112 are coupled to the first scan line 411, and the first TFT 111 and the second TFT 112 drive two pixels P at two sides of the first scan line 411 respectively. The second scan lines 412 are insulated with the first TFT 111 and the second TFT 112. In the embodiment, one first scan line 411 and one second scan line 412 define a scan line group. The second scan line 412 is a redundancy or dummy line and is set as a repair line instead of the first scan line 411 while the first scan line 411 is broken. In another embodiment, the second scan line 412 can be omitted to improve an opening ratio of the TFT array substrate 110.

The first TFT 111 is coupled to the first scan line 411 and the first data line 421. The second TFT 112 is coupled to the first scan line 411 and the second data line 422. In the embodiment, the first TFT 111 and the second TFT 112 are overlapped on the first scan line 411 so as to define a TFT assembly.

The gate electrode 111a of the first TFT 111 is coupled to the first scan line 411. The first source electrode 111c of the first TFT 111 is coupled to the first data line 421. The first drain electrode 111d of the first TFT 111 is coupled to the pixel electrode 114 of the pixel P located at upward side of the first scan line 411. The second source electrode 112c of the second TFT 112 is coupled to the second data line 422. The second drain electrode 112d of the second TFT 112 is coupled to the pixel electrodes 114 of the pixel P located at downward side of the first scan line 411. Thus, the first TFT 111 is controlled by the first scan line 411 and the first data line 421; the second TFT 112 is controlled by the first scan line 411 and the second data line 422.

Figure 3:
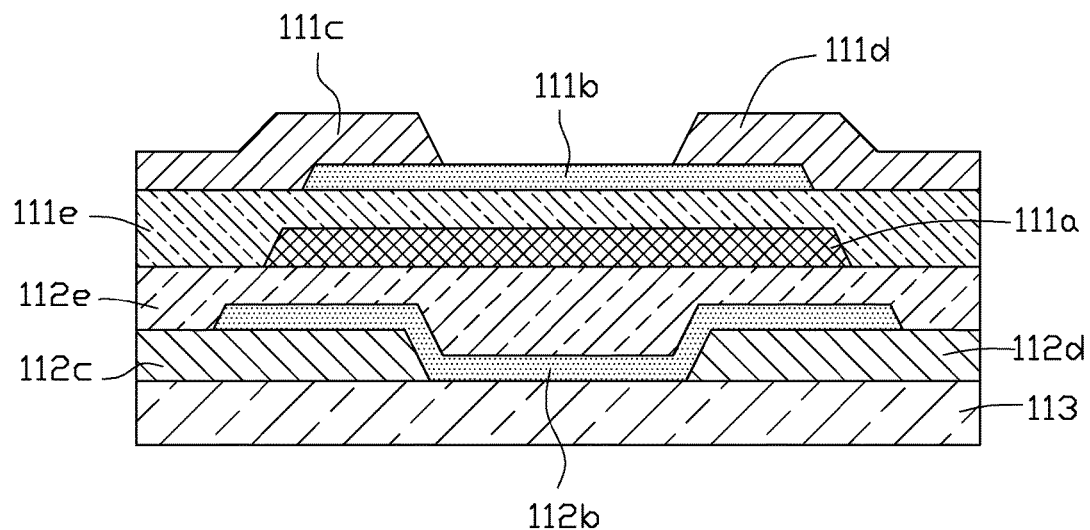
FIG. 3 is a cross-sectional view of the TFT array substrate of a first embodiment, taken along line III-III of FIG. 2.

Referring to FIG. 3, the TFT assembly is disposed on a substrate 113 of the TFT array substrate 110. The TFT assembly further includes a first gate insulating layer 111e, and a second gate insulating layer 112e. The first TFT includes a gate electrode 111a, a first channel layer 111b, a first source electrode 111c, and a first drain electrode 111d. The second TFT 112 includes a second channel layer 112b, a second source electrode 112c, a second drain electrode 112d, and the gate electrode 111a. Each of the first TFT 111 and the second TFT shares the gate electrode 111a. In the embodiment, the gate electrode 111a is a part of the first scan line 411. In another embodiment, the gate electrode 111a can also be an embranchment coupled to the first scan line 411.

In the embodiment, the first TFT 111 is a bottom gate type TFT, and the second TFT 112 is a top gate type TFT. The second source electrode 112c, the second drain electrode 112d, and the second channel layer 112b are formed on the substrate 113. Two sides of the second channel layer 112b cover the second source electrode 112c and the second drain electrode 112d respectively. The second gate insulating layer 112e covers the second source electrode 112c, the second drain electrode 112d, and the second channel layer 112b. The gate electrode 111a is formed on the second gate insulating layer 112e corresponding to the second channel layer 112b. The first gate insulating layer 111e is formed on the second gate insulating layer 112e and covers the gate electrode 111a. The first source electrode 111c, the first drain electrode 111d, and the first channel layer 111b are formed on the first gate insulating layer 111e. The first channel layer 111b is corresponding to the gate electrode 111a. The first source electrode 111c and the first drain electrode 111d cover two sides of the first channel layer 111b respectively. The TFT array substrate 110 may further includes some traditional structures, such as a channel protection layer or a passivation layer, and the traditional structures are well-known and need not be repeated here.

The gate electrode 111a of the first TFT 111 is coupled to the first scan line 411. The first source electrode 111c of the first TFT 111 is coupled to the first date line 421. The first drain electrode 111d of the first TFT 111 is coupled to the pixel electrode 114 of the pixel P located at upward side of the first scan line 411. The second source electrode 112c of the second TFT 112 is coupled to the second date line 422. The second drain electrode 112d of the second TFT 112 is coupled to the pixel electrodes 114 of the pixel P located at downward side of the first scan line 411. Thus, the first TFT 111 is controlled by the first scan line 411 and the first date line 421; the second TFT 112 is controlled by the first scan line 411 and the second date line 422.

Thus, one first scan lines 411 could control two rows of the pixels P at two side of the first scan line 411, and then a quantity of the first scan lines which couple the pixel electrodes 114 is reduced. Thus, an opening ratio of the TFT array substrate 110 is improved.

Figure 4:
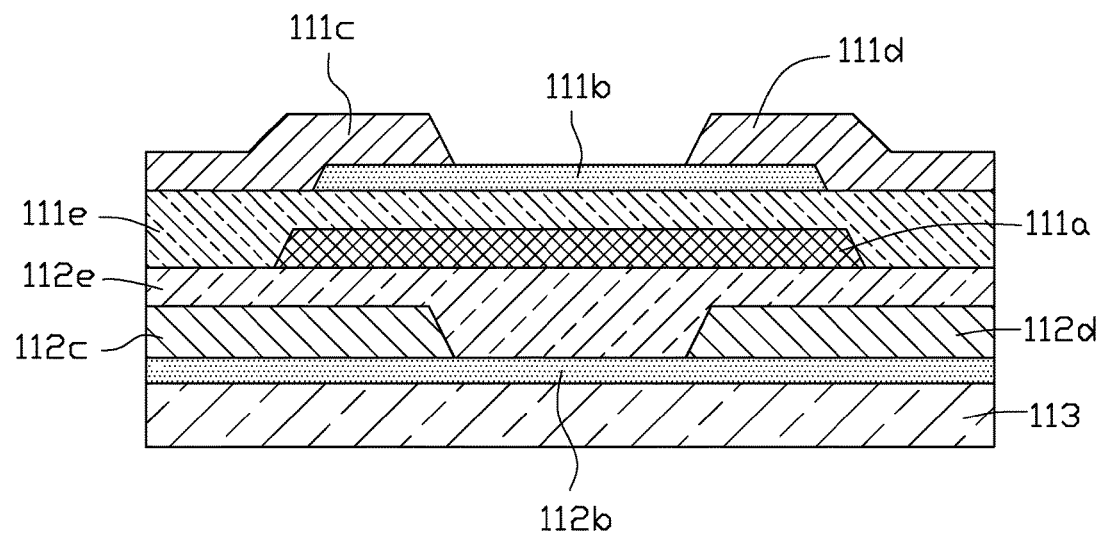
FIG. 4 is a cross-sectional view of the TFT array substrate of a second embodiment, taken along line III-III of FIG. 2.

FIG. 4 shows a second embodiment of the TFT array substrate 110. In the embodiment, the first TFT 111 is a bottom gate type TFT, and the second TFT 112 is a top gate type TFT. The second channel layer 112b is formed on the substrate 113. The second source electrode 112c and the second drain electrode 112d are formed on the second channel layer 112b and cover two sides of the second channel layer 112b respectively. The second gate insulating layer 112e covers the second source electrode 112c, the second drain electrode 112d, and the second channel layer 112b. The gate electrode 111a is formed on the second gate insulating layer 112e corresponding to a portion of the second channel layer 112b which is not covered by the second source electrode 112c and the second drain electrode 112d. The first gate insulating layer 111e is formed on the second gate insulating layer 112e and covers the gate electrode 111a. The first source electrode 111c, the first drain electrode 111d, and the first channel layer 111b are formed on the first gate insulating layer 111e. The first channel layer 111b is corresponding to the gate electrode 111a. The first source electrode 111c and the first drain electrode 111d cover two sides of the first channel layer 111b respectively. The TFT array substrate 110 may further includes some traditional structures, such as a channel protection layer or a passivation layer, and the traditional structures are well-known and need not be repeated here.

An opening ratio of the display panel 100 with each of the TFT array substrates 110 of the first embodiment and the second embodiment can be higher than a traditional TFT array substrate.

Figure 5:
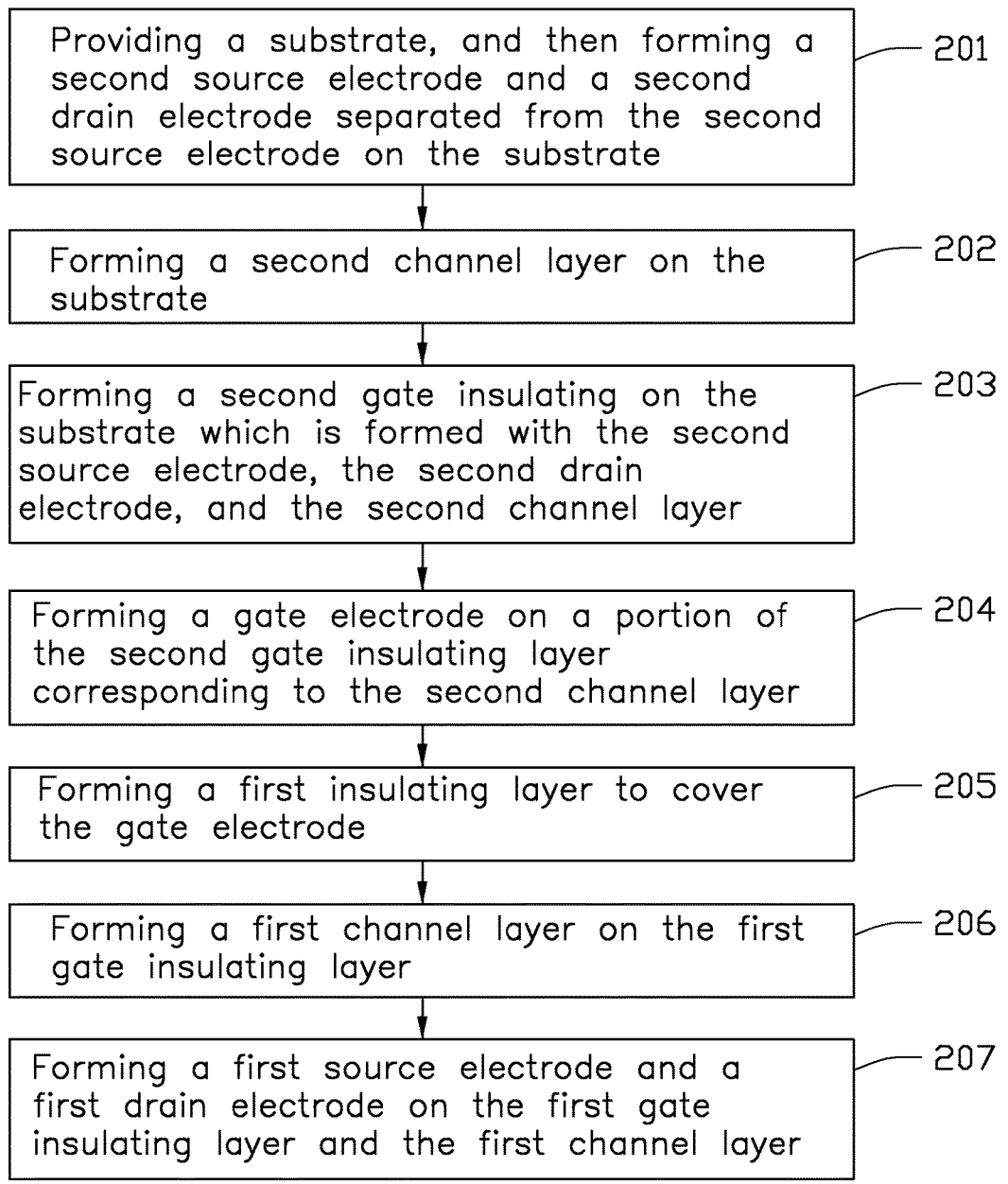
FIG. 5 is a flowchart of an embodiment of a method of manufacturing the TFT array substrate in FIG. 3.

Referring to FIG. 5, a flowchart for manufacturing the TFT array substrate 110 of the first embodiment is presented in accordance with an example embodiment which is being thus illustrated. The example method is provided by way of example, as there are a variety of ways to carry out the method. The method described below can be carried out using the configurations illustrated in FIGS. 6 to 12, for example, and various elements of these figures are referenced in explaining example method. Each block shown in FIG. 5 represents one or more processes, methods or sub-routines, carried out in the exemplary method. Furthermore, the illustrated order of blocks is by example only and the order of the blocks can change according to the present disclosure. Additional blocks may be added or fewer blocks may be utilized, without departing from this disclosure. The exemplary method can begin at block 201.

Figure 6:
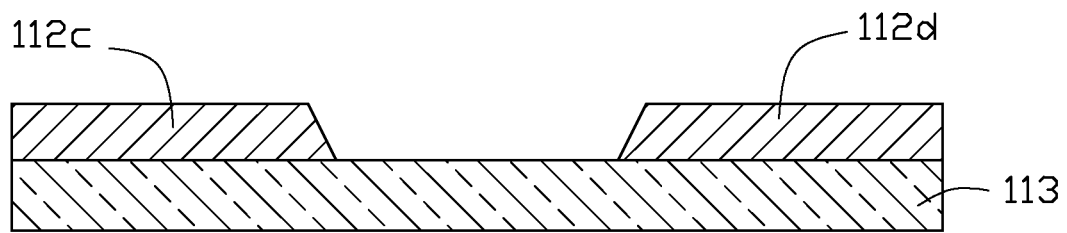
FIG. 6 illustrates that a substrate, a second source electrode, and a second drain electrode are provided.

At block 201, referring to FIG. 6, a substrate 113 is provided, and then a second source electrode 112c and a second drain electrode 112d separated from the second source electrode 112c are formed on the substrate 113. In detail, a metal layer (not labeled) is formed on the substrate 113, and then the second source electrode 112c and the second drain electrode 112d are formed by patterning the metal layer.

Figure 7:
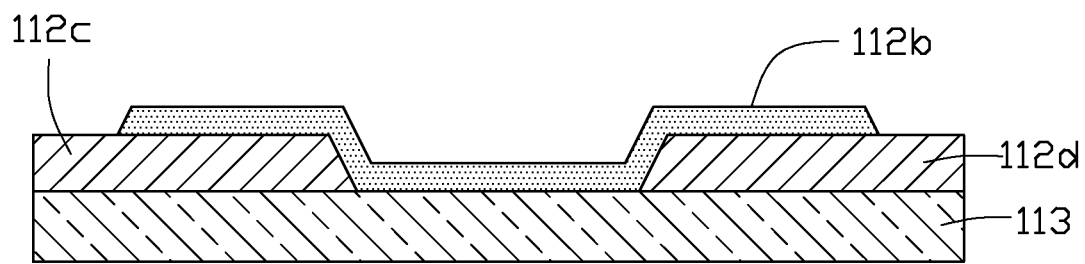
FIG. 7 illustrates that a second channel layer is formed.

At block 202, referring to FIG. 7, a semiconductive layer is formed on the substrate 113 and is patterned to cause two sides of the semiconductive layer cover the second source electrode 112c and the second drain electrode 112d respectively. The patterned semiconductive layer serves as the second channel layer 112b. In the embodiment, the semiconductive layer is made of metal oxide. In other embodiments, the semiconductive layer can also be made of amorphous silicon, polycrystalline silicon, or other semiconductor materials.

Figure 8:
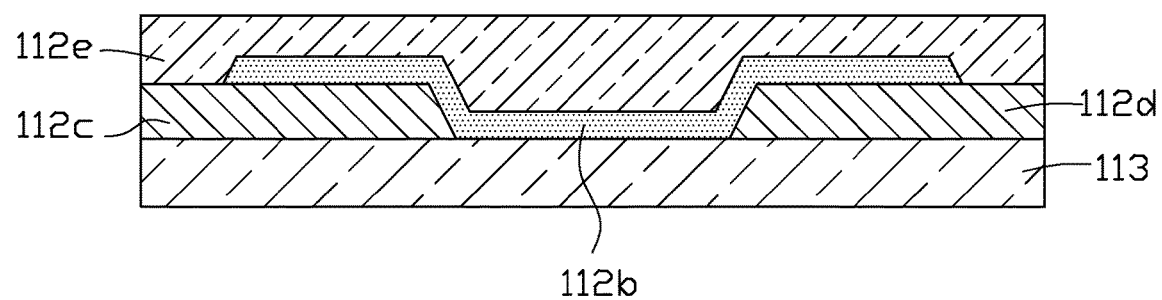
FIG. 8 illustrates that a second gate insulating layer is formed.

At block 203, referring to FIG. 8, an insulating layer is formed on the substrate 113 which is formed with the second source electrode 112c, the second drain electrode 112d, and the second channel layer 112b, so as to serve as the second gate insulating layer 112e to cover the second source electrode 112c, the second drain electrode 112d, and the second channel layer 112b.

Figure 9:
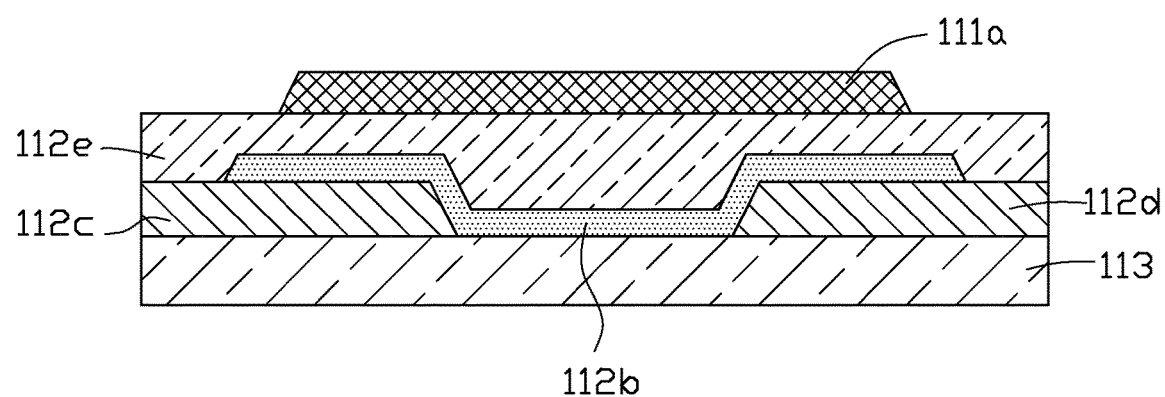
FIG. 9 illustrates that a gate electrode is formed.

At block 204, referring to FIG. 9, a gate electrode 111a is formed on a portion of the second gate insulating layer 112e corresponding to the second channel layer 112b. In detail, a metal layer (not labeled) is formed on the second gate insulating layer 112e, and then the gate electrode 111a is formed by patterning the metal layer.

Figure 10:
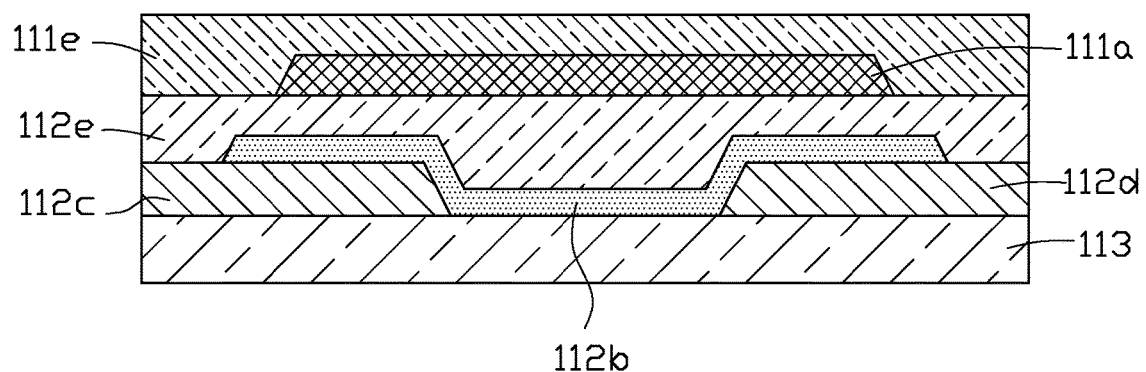
FIG. 10 illustrates that a first gate insulating layer is formed.

At block 205, referring to FIG. 10, another insulating layer serves as the first gate insulating layer 111e is formed to cover the gate electrode 111a.

Figure 11:
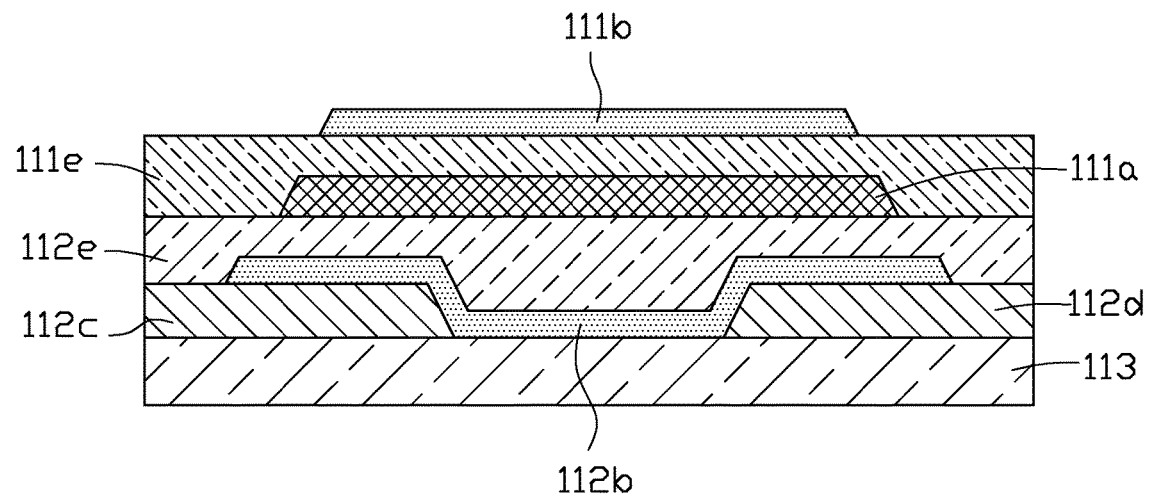
FIG. 11 illustrate that a first channel layer is formed.

At block 206, referring to FIG. 11, a semiconductive layer is formed on the first gate insulating layer 111e and is patterned to be corresponding to the gate electrode 111a. The patterned semiconductive layer serves as the first channel layer 111b. In the embodiment, the semiconductive layer is made of metal oxide. In other embodiments, the semiconductive layer can also be made of amorphous silicon, polycrystalline silicon, or other semiconductor materials.

Figure 12:
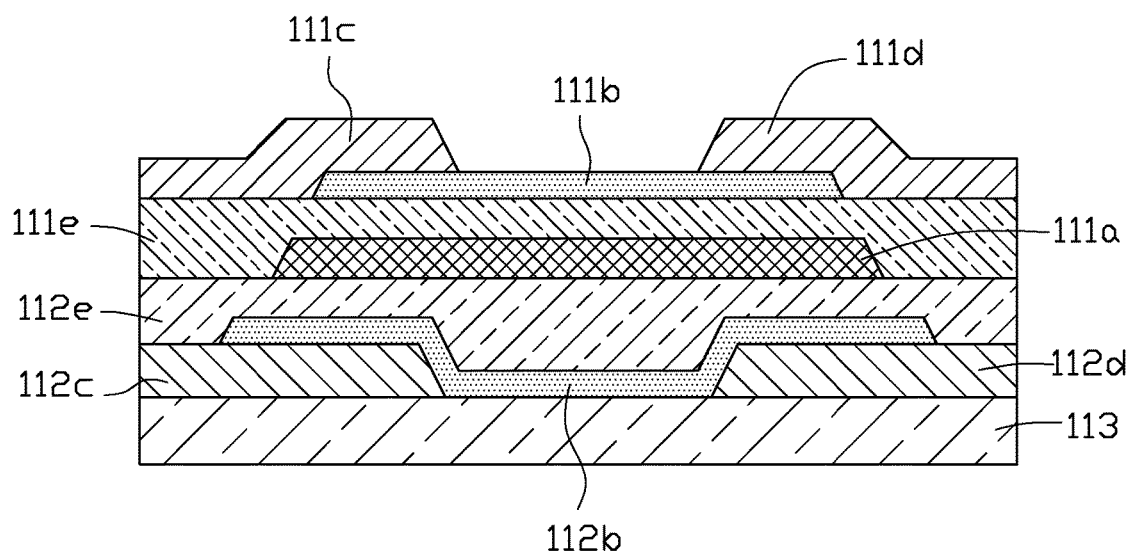
FIG. 12 illustrate that a first source electrode and a first drain electrode are formed.

At block 207, referring to FIG. 12, a first source electrode 111c and a first drain electrode 111d are formed on the first gate insulating layer 111e and the first channel layer 111b. The first source electrode 111c and the first drain electrode 111d cover two sides of the first channel layer 111b respectively. In detail, a metal layer is formed on the first gate insulating layer 111e and the first channel layer 111b, and then the first source electrode 111c and the first drain electrode 111d are formed by patterning the metal layer.

After the first source electrode 111c and the first drain electrode 111d are formed, traditional structures, such as a passivation layer and a pixel electrode, can also be formed. A method of forming the traditional structures is well-known and need not be repeated here.

The present thin film transistor substrate 100 is thus obtained.

Figure 13:
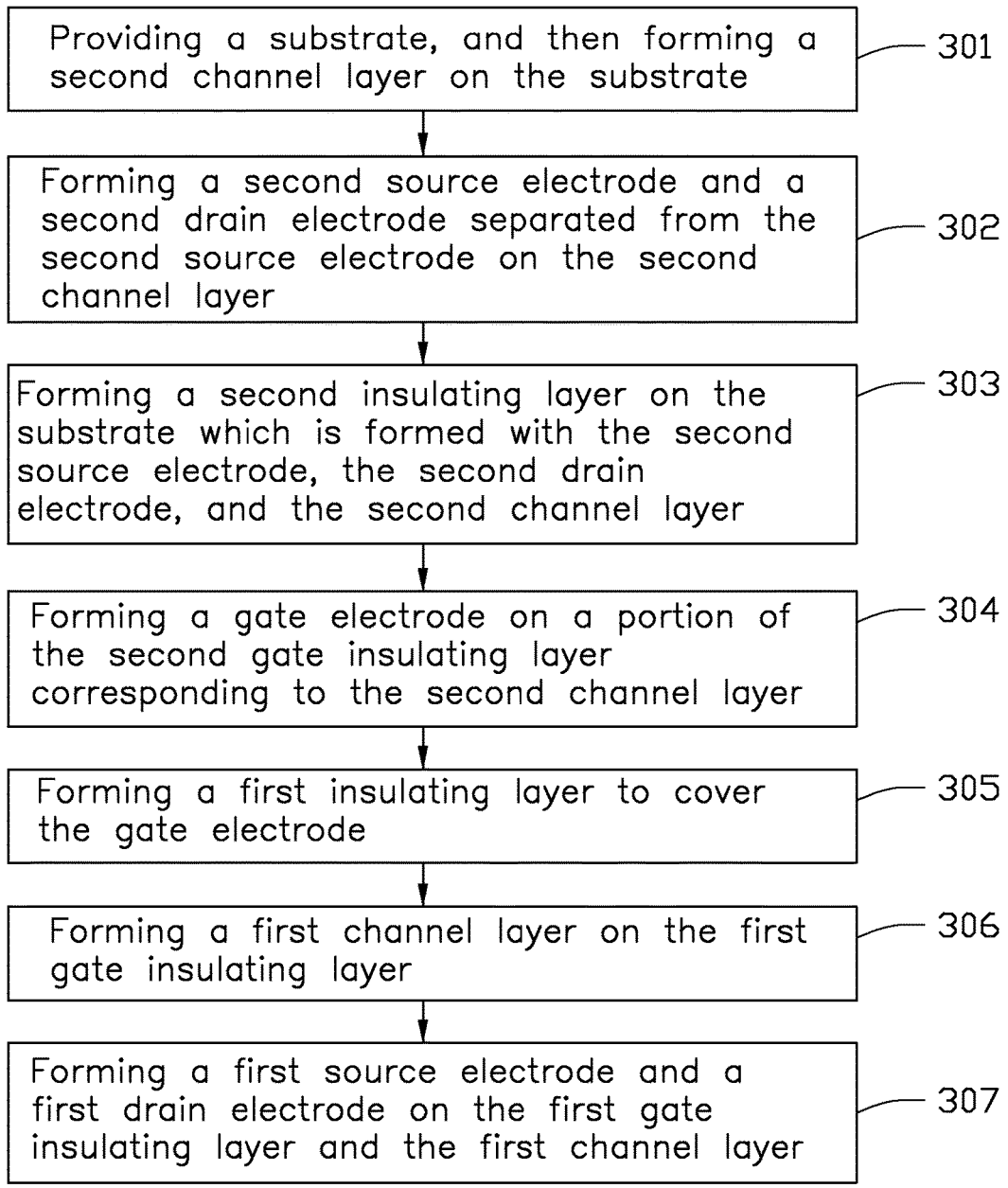
FIG. 13 is a flowchart of an embodiment of a method of manufacturing the TFT array substrate in FIG. 4.

Referring to FIG. 13, a flowchart for manufacturing the TFT array substrate 110 of the second embodiment is presented in accordance with an example embodiment which is being thus illustrated. The example method is provided by way of example, as there are a variety of ways to carry out the method. The method described below can be carried out using the configurations illustrated in FIGS. 14 to 20, for example, and various elements of these figures are referenced in explaining example method. Each block shown in FIG. 13 represents one or more processes, methods or subroutines, carried out in the exemplary method. Furthermore, the illustrated order of blocks is by example only and the order of the blocks can change according to the present disclosure. Additional blocks may be added or fewer blocks may be utilized, without departing from this disclosure. The exemplary method can begin at block 301.

Figure 14:
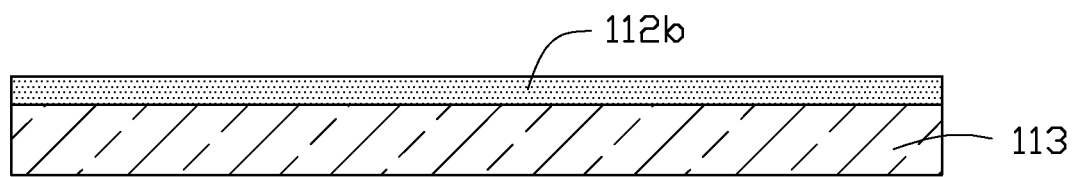
FIG. 14 illustrates that a substrate and a second channel layer are formed.

At block 301, referring to FIG. 14, a substrate 113 is provided, and then a semiconductive layer is formed on the substrate 113. The semiconductive layer serves as the second channel layer 112b. In the embodiment, the semiconductive layer is made of metal oxide. In other embodiments, the semiconductive layer can also be made of amorphous silicon, polycrystalline silicon, or other semiconductor materials.

Figure 15:
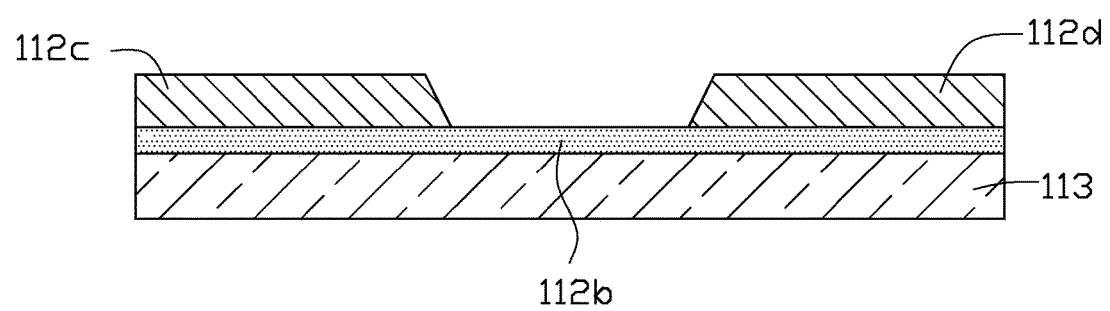
FIG. 15 illustrates that a second source electrode and a second drain electrode are formed.

At block 302, referring to FIG. 15, a second source electrode 112c and a second drain electrode 112d separated from the second source electrode 112c are formed on the second channel layer 112b. The second source electrode 112c and the second drain electrode 112d cover two sides of the second channel layer 112b respectively. In detail, a metal layer (not labeled) is formed on the second channel layer 112b, and then the second source electrode 112c and the second drain electrode 112d are formed by patterning the metal layer.

Figure 16:
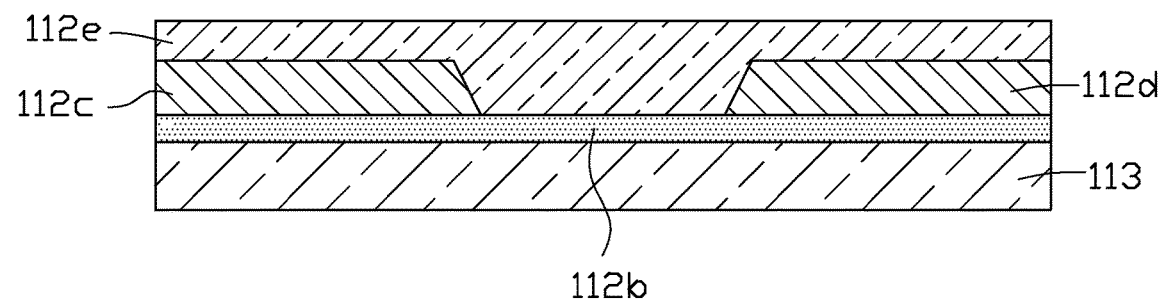
FIG. 16 illustrates that a second gate insulating layer is formed.

At block 303, referring to FIG. 16, an insulating layer is formed on the substrate 113 which is formed with the second source electrode 112c, the second drain electrode 112d, and the second channel layer 112b, so as to serve as the second gate insulating layer 112e to cover the second source electrode 112c, the second drain electrode 112d, and the second channel layer 112b.

Figure 17:
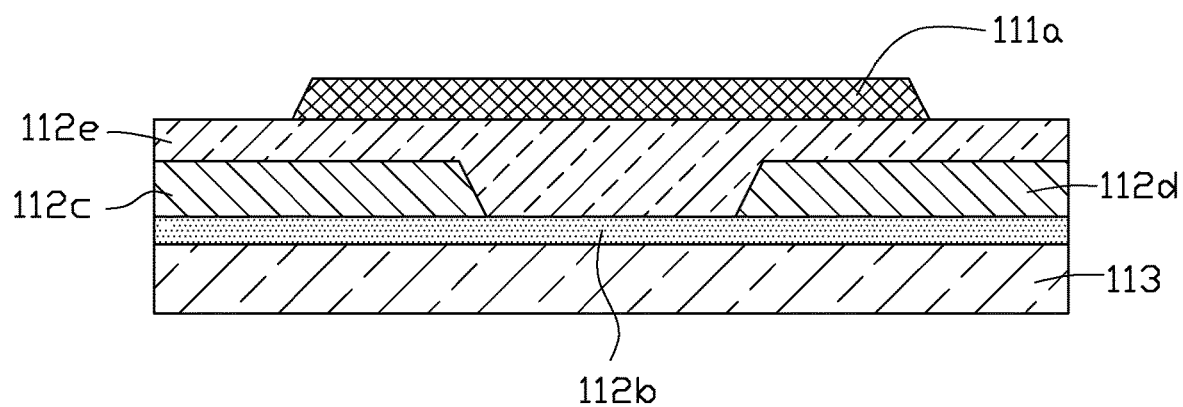
FIG. 17 illustrates that a gate electrode is formed.

At block 304, referring to FIG. 17, a gate electrode 111a is formed on a portion of the second gate insulating layer 112e corresponding to the second channel layer 112b. In detail, a metal layer (not labeled) is formed on the second gate insulating layer 112e, and then the gate electrode 111a is formed by patterning the metal layer.

Figure 18:
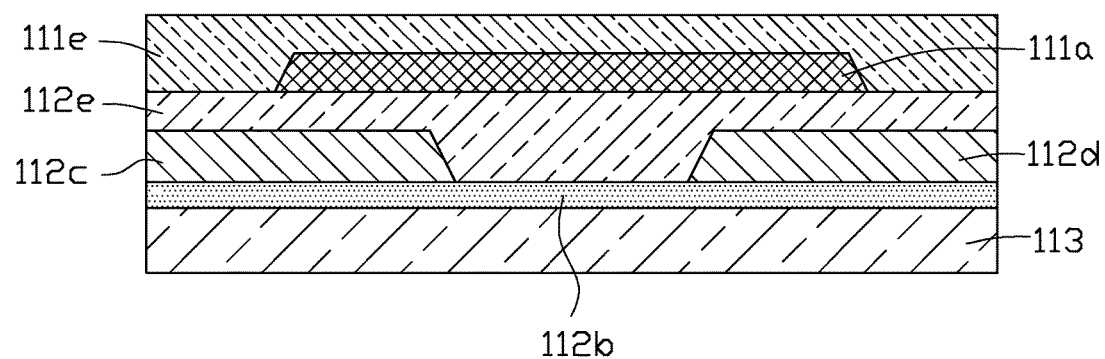
FIG. 18 illustrates that a first gate insulating layer is formed.

At block 305, referring to FIG. 18, another insulating layer serves as the first gate insulating layer 111e is formed to cover the gate electrode 111a.

Figure 19:
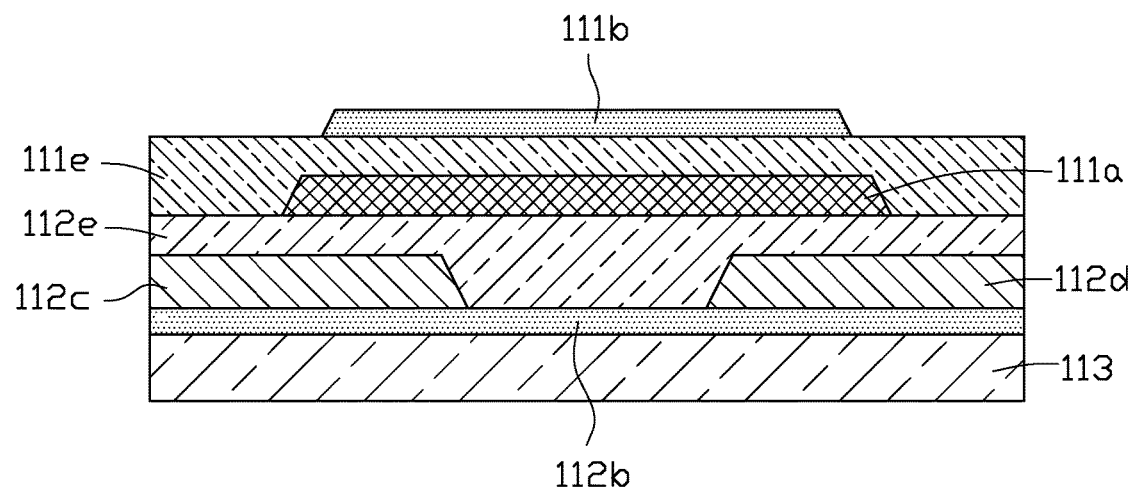
FIG. 19 illustrates that a first channel layer is formed.

At block 306, referring to FIG. 19, a semiconductive layer is formed on the first gate insulating layer 111e and is patterned to be corresponding to the gate electrode 111a. The patterned semiconductive layer serves as the first channel layer 111b. In the embodiment, the semiconductive layer is made of metal oxide. In other embodiments, the semiconductive layer can also be made of amorphous silicon, polycrystalline silicon, or other semiconductor materials.

Figure 20:
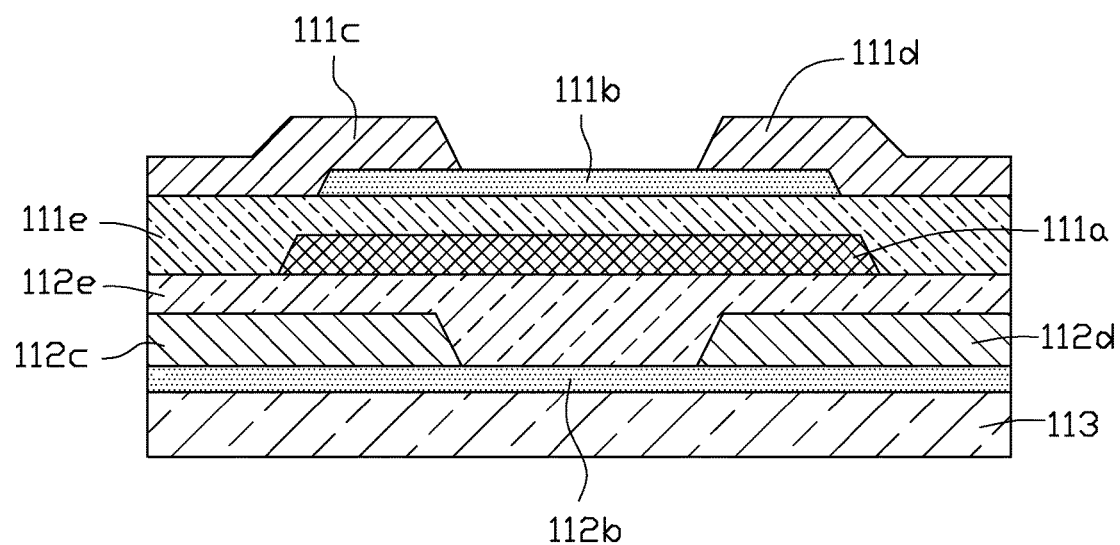
FIG. 20 illustrates that a first source electrode and a first drain electrode are formed.

At block 307, referring to FIG. 20, a first source electrode 111c and a first drain electrode 111d are formed on the first gate insulating layer 111e and the first channel layer 111b. The first source electrode 111c and the first drain electrode 111d cover two sides of the first channel layer 111b respectively. In detail, a metal layer is formed on the first gate insulating layer 111e and the first channel layer 111b, and then the first source electrode 111c and the first drain electrode 111d are formed via patterning the metal layer.

After the first source electrode 111c and the first drain electrode 111d are formed, traditional structures, such as a passivation layer and a pixel electrode, can also be formed. A method of forming the traditional structures is well-known and need not be repeated here.

The present thin film transistor substrate 100 is thus obtained.

The embodiments shown and described above are only examples. Many details are often found in the art such as the other features of a TFT array substrate, a display panel using the TFT array substrate, and a method for manufacturing the TFT array substrate. Therefore, many such details are neither shown nor described. Even though numerous characteristics and advantages of the present technology have been set forth in the foregoing description, together with details of the structure and function of the present disclosure, the disclosure is illustrative only, and changes may be made in the detail, especially in matters of shape, size and arrangement of the parts within the principles of the present disclosure up to, and including the full extent established by the broad general meaning of the terms used in the claims. It will therefore be appreciated that the embodiments described above may be modified within the scope of the claims.

What is claimed is:

1. A thin film transistor (TFT) array substrate comprising:
a plurality of scan lines comprising a plurality of first scan lines, each of the plurality of first scan lines having a first side and a second side opposite to the first side;
a plurality of data lines insulated with the plurality of scan lines and comprising a plurality of first data lines and a plurality of second data lines, each of the plurality of first data lines insulated with the plurality of second data lines and at least partly covering one of the plurality of second data lines;

a plurality of pixels, each of the plurality of pixels being defined by two adjacent scan lines and two adjacent first data lines;

a plurality of first TFTs, each of the plurality of first TFTs configured to drive one of the plurality of pixels at the first side of one of the plurality of first scan lines and electrically coupled to the same one of the plurality of first scan lines and one of the plurality of first data lines; and a plurality of second TFTs, each of the plurality of second TFTs configured to drive one of the plurality of pixels at the second side of one of the plurality of first scan lines and electrically coupled to the same one of the plurality of first scan lines and one of the plurality of second data lines.

2. The TFT array substrate of claim 1, wherein the first TFT covers the second TFT.

3. The TFT array substrate of claim 2, wherein the first TFT and the second TFT shares a same gate electrode.

4. The TFT array substrate of claim 3, wherein the first TFT further comprises a first channel layer, a first source electrode, and a first drain electrode; the second TFT further comprises a second channel layer, a second source electrode, and a second drain electrode; the first source electrode is coupled to the first data line; the second drain electrode is coupled to the second data line; the TFT array substrate further comprises a substrate, a first gate insulating layer, and a second gate insulating layer; the second source electrode, the second drain electrode, and the second channel layer are formed on the substrate; two sides of the second channel layer cover the second source electrode and the second drain electrode respectively; the second gate insulating layer covers the second source electrode, the second drain electrode, and the second channel layer; the gate electrode is formed on the second gate insulating layer corresponding to the second channel layer; the first gate insulating layer is formed on the second gate insulating layer and covers the gate electrode; the first source electrode, the first drain electrode, and the first channel layer are formed on the first gate insulating layer; the first channel layer corresponds to the gate electrode; and the first source electrode and the first drain electrode cover two sides of the first channel layer respectively.

5. The TFT array substrate of claim 3, wherein the first TFT further comprises a first channel layer, a first source electrode, and a first drain electrode; the second TFT further comprises a second channel layer, a second source electrode, and a second drain electrode; the first source electrode is coupled to the first data line; the second drain electrode is coupled to the second data line; the TFT array substrate further comprises a substrate, a first gate insulating layer, and a second gate insulating layer; the second channel layer is formed on the substrate; the second source electrode and the second drain electrode are formed on the second channel layer and cover two sides of the second channel layer respectively; the second gate insulating layer covers the second source electrode, the second drain electrode, and the second channel layer; the gate electrode is formed on the second gate insulating layer corresponding to a portion of the second channel layer which is not covered by the second source electrode and the second drain electrode; the first gate insulating layer is formed on the second gate insulating layer and covers the gate electrode; the first source electrode, the first drain electrode, and the first channel layer are formed on the first gate insulating layer; the first channel layer corresponds to the gate electrode; and the first source electrode and the first drain electrode cover two sides of the first channel layer respectively.

6. The TFT array substrate of claim 3, wherein the gate electrode is a part of the first scan line.

7. The TFT array substrate of claim 1, wherein the plurality of scan lines comprise a plurality of second scan lines insulated with the plurality of first scan lines; each of the plurality of pixels is defined by one of the plurality of first scan lines, one of the plurality of second scan lines adjacent to the one of the plurality of first scan lines, and two adjacent first data lines.

8. A display panel, comprising:
a TFT array substrate comprising:
a plurality of scan lines comprising a plurality of first scan lines, each of the plurality of first scan lines having a first side and a second side opposite to the first side;

a plurality of data lines insulated with the plurality of scan lines and comprising a plurality of first data lines and a plurality of second data lines, each of the plurality of first data lines insulated with the plurality of second data lines and at least partly covering one of the plurality of second data lines;

a plurality of pixels, each of the plurality of pixels being defined by two adjacent scan lines and two adjacent first data lines;

a plurality of first TFTs, each of the plurality of first TFTs configured to drive one of the plurality of pixels at the first side of one of the plurality of first scan lines and electrically coupled to the same one of the plurality of first scan lines and one of the plurality of first data lines; and a plurality of second TFTs, each of the plurality of second TFTs configured to drive one of the plurality of pixels at the second side of one of the plurality of first scan lines and electrically coupled to the same one of the plurality of first scan lines and one of the plurality of second data lines.

9. The display panel of claim 8, wherein the first TFT covers the second TFT.

10. The display panel of claim 9, wherein the first TFT and the second TFT shares a same gate electrode.

11. The display panel of claim 10, wherein the first TFT further comprises a first channel layer, a first source electrode, and a first drain electrode; the second TFT further comprises a second channel layer, a second source electrode, and a second drain electrode; the first source electrode is coupled to the first data line; the second drain electrode is coupled to the second data line; the TFT array substrate further comprises a substrate, a first gate insulating layer, and a second gate insulating layer; the second source electrode, the second drain electrode, and the second channel layer are formed on the substrate; two sides of the second channel layer cover the second source electrode and the second drain electrode respectively; the second gate insulating layer covers the second source electrode, the second drain electrode, and the second channel layer; the gate electrode is formed on the second gate insulating layer corresponding to the second channel layer; the first gate insulating layer is formed on the second gate insulating layer and covers the gate electrode; the first source electrode, the first drain electrode, and the first channel layer are formed on the first gate insulating layer; the first channel layer corresponds to the gate electrode; and the first source electrode and the first drain electrode cover two sides of the first channel layer respectively.

12. The display panel of claim 10, wherein the first TFT further comprises a first channel layer, a first source electrode, and a first drain electrode; the second TFT further comprises a second channel layer, a second source electrode, and a second drain electrode; the first source is coupled to the first data line; the second drain electrode is coupled to the second data line; the TFT array substrate further comprises a substrate, a first gate insulating layer, and a second gate insulating layer; the second channel layer is formed on the substrate; the second source electrode and the second drain electrode are formed on the second channel layer and cover two sides of the second channel layer respectively; the second gate insulating layer covers the second source electrode, the second drain electrode, and the second channel layer; the gate electrode is formed on the second gate insulating layer corresponding to a portion of the second channel layer which is not covered by the second source electrode and the second drain electrode; the first gate insulating layer is formed on the second gate insulating layer and covers the gate electrode; the first source electrode, the first drain electrode, and the first channel layer are formed on the first gate insulating layer; the first channel layer corresponds to the gate electrode; and the first source electrode and the first drain electrode cover two sides of the first channel layer respectively.

13. The display panel of claim 10, wherein the gate electrode is a part of the first scan line.

14. The display panel of claim 10, wherein the plurality of scan lines comprise a plurality of second scan lines insulated with the plurality of first scan lines; each of the plurality of pixels is defined by one of the plurality of first scan lines, one of the plurality of second scan lines adjacent to the one of the plurality of first scan lines, and two adjacent first data lines.

* * * * *